United States Patent
Edwards (10) Patent No.: US 7,176,736 B2
(45) Date of Patent: Feb. 13, 2007

(54) HIGH-SPEED, CURRENT DRIVEN LATCH

(75) Inventor: Karl Edwards, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 10/761,753

(22) Filed: Jan. 20, 2004

(65) Prior Publication Data

US 2004/0150450 A1    Aug. 5, 2004

Related U.S. Application Data

(62) Division of application No. 10/350,927, filed on Jan. 22, 2003, now Pat. No. 6,750,690, which is a division of application No. 09/510,181, filed on Feb. 22, 2000, now Pat. No. 6,535,042.

(51) Int. Cl.
  *H03K 3/037* (2006.01)
(52) U.S. Cl. ............ 327/217; 327/199; 327/200; 327/201; 327/204; 327/207
(58) Field of Classification Search ........ 327/197, 327/198, 199, 201, 217; 331/52, 62, 70, 331/111, 150, 152, 176
See application file for complete search history.

(56) References Cited

U.S. PATENT DOCUMENTS

| | | | |
|---|---|---|---|
| 4,590,444 A * | 5/1986 | Wilcox | 331/111 |
| 4,791,315 A | 12/1988 | Gontowski, Jr. | 327/217 |
| 5,541,456 A * | 7/1996 | Maggioni et al. | 307/10.1 |
| 5,541,544 A * | 7/1996 | Nakano | 327/217 |
| 5,565,819 A * | 10/1996 | Cooper | 331/111 |
| 5,604,456 A | 2/1997 | Nitta | 327/217 |
| 5,701,105 A | 12/1997 | Park | 331/153 |
| 6,020,792 A * | 2/2000 | Nolan et al. | 331/111 |
| 6,052,035 A | 4/2000 | Nolan et al. | 331/74 |
| 6,118,315 A * | 9/2000 | Guedj | 327/143 |
| 6,326,859 B1 | 12/2001 | Goldman et al. | 331/143 |
| 6,356,161 B1 | 3/2002 | Nolan et al. | 331/176 |

* cited by examiner

*Primary Examiner*—Timothy P. Callahan
*Assistant Examiner*—Hiep Nguyen
(74) *Attorney, Agent, or Firm*—Fish & Neave IP Group, Ropes & Gray LLP; Jeffrey C. Aldridge (57) ABSTRACT

A high-speed, current-driven latch is provided. The latch conducts a current and includes an output, a SET circuit and a RESET circuit. The output is variable between a first state and a second state. The SET circuit conducts the current present in the latch at the first state such that the SET circuit is maintained close to a level required to change the output of the transistor from the first to the second level, and the RESET circuit conducts the current at the second level such that the RESET circuit is close to a level required to change the output of the transistor from the second level to the first level.

5 Claims, 8 Drawing Sheets

HIGH-SPEED, CURRENT DRIVEN LATCH

This is a divisional of application Ser. No. 10/350,927, filed Jan. 22, 2003 (now U.S. Pat. No. 6,750,690), which is a divisional of application Ser. No. 09/510,181, filed Feb. 22, 2000 (now U.S. Pat. No. 6,535,042). These prior applications are hereby incorporated by reference herein in their entireties.

BACKGROUND OF THE INVENTION

This invention relates to latch circuits. More specifically, this invention relates to latches that have significantly reduced turn-ON and turn-OFF times.

Figure 1:
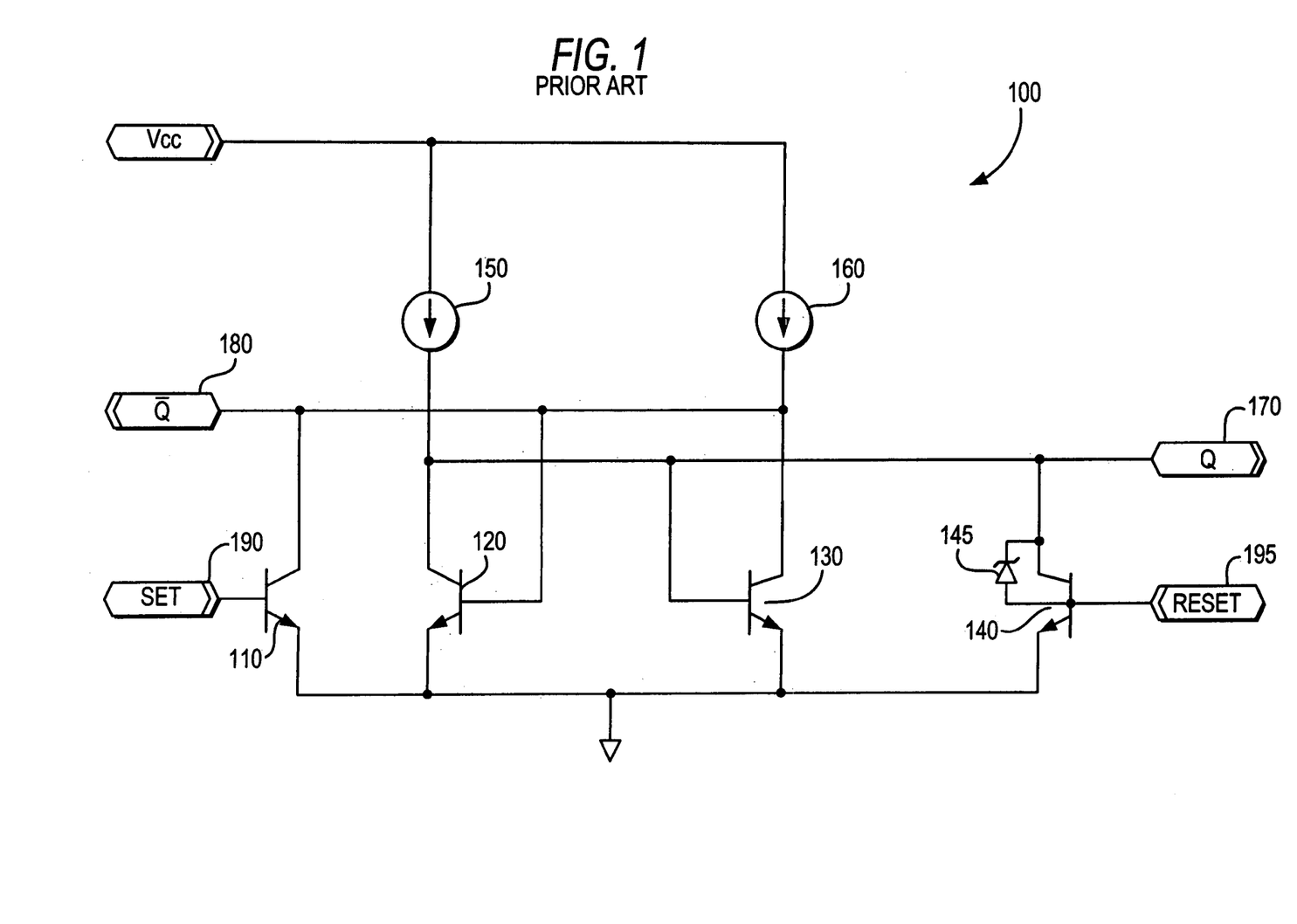
FIG. 1 is a circuit diagram of a conventional latch circuit.

FIG. 1 shows a conventional latch 100 formed by a cross-coupled pair of transistors, transistors 120 and 130. Hereafter, the term cross-coupled transistors is used herein to refer to two transistors wherein the base of one is connected to the collector-emitter circuit of the other. Two additional transistors, transistors 110 and 140, are coupled to the SET 190 and RESET 195 inputs of the circuit, and are labeled SET and RESET because they are used to trigger changes in the output state of latch 100. Transistors 110, 120, 130 and 140 may each include a shottky diode, such as shottky diode 145, across their respective collector/base junctions to prevent saturation, but only shottky diode 145 is shown to simplify the drawing.

The following is an exemplary truth table for the operation of the latch in FIG. 1:

|   | RESET | SET | $Q_{n+1}$ |
|---|---|---|---|
| A | 0 | 0 | $Q_n$ |
| B | 0 | 1 | 1 |
| C | 1 | 0 | 0 |
| D | 1 | 1 | not used |

The outputs are labeled Q 170 and $\overline{Q}$ 180. These outputs are complementary—i.e., when Q 170 is high, $\overline{Q}$ 180 is low and vice versa.

Latch 100 is considered SET when Q 170 is high and $\overline{Q}$ 180 is low. It is RESET when Q 170 is low and $\overline{Q}$ 180 is high. The operation of transistors 110, 120, 130 and 140 to produce the results found in the truth table above is well known.

One potential problem exists, however, with this circuit, as follows.

In normal storage operation, i.e., the state where both inputs SET 190 and RESET 195 are held close to ground, the outputs, Q 170 and $\overline{Q}$ 180, retain their previous state. This operation is shown in state A in the table above. In this state, the base of the SET and RESET transistors, transistors 110 and 140 respectively, are also held close to ground by SET 190 and RESET 195 inputs. To change the latch state, the base of one of transistors 110 and 140 must be pulled up by at least a $V_{be}$ (approximately 700 millivolts) in order to turn the transistor ON and are, therefore, voltage-driven—i.e., require a significant change in voltage to turn ON. This substantial difference in voltage required to alter the output value of the latch causes a delay because of the time constant associated with charging the base capacitance of the SET or RESET transistors with the full $V_{be}$ voltage and charging the base capacitance of the device driving the base of the SET or RESET transistors with the full $V_{be}$ voltage. The delay slows the operation of the latch. This problem is particularly relevant when the drive to the SET or RESET transistors is from the collector of a PNP.

There are several ECL (emitter-coupled logic) type latches that are commonly used to overcome this problem. They provide a solution by operating all the transistors in the active region and not in the saturated region. This reduces turn-OFF and turn-ON times because the transistors are not being fully charged and fully drained for each state change of the latch. However, these latches tend to be more complex than common latches and require input/output level shifting.

Therefore, it would be desirable to provide a simple latch that changes state in a substantially reduced time period.

SUMMARY OF THE INVENTION

Therefore, it is an object of this invention to provide a simple latch that changes state in a substantially reduced time period.

A latch circuit having at least one output and conducting a current is provided. A number of individual current sources may be utilized to produce the current. The latch circuit also includes a SET circuit and a RESET circuit. The SET circuit may include a first transistor and a SET transistor. The RESET circuit may include a second transistor and a RESET transistor. The first and second transistors may be cross-coupled to one another such that the base of one of the transistors is coupled to the collector-emitter circuit of the other. The SET transistor and the RESET transistor may receive a control signal at their respective bases to trigger the latch circuit to change output state. The latch circuit has at least two distinct output states. The SET transistor and the RESET transistor are coupled to the first and second transistors such that a small control signal supplied to one of the SET and RESET transistors varies the output of the latch between a first state and a second state. At the first output state of a latch according to the invention, the current may be conducted by the first transistor and the SET transistor, and at the second state, the current may be conducted by the second transistor and RESET transistor.

A latch circuit according to the invention reduces switching time because it maintains at least one of the SET and RESET transistors in a condition that is very close to triggering the latch circuit to change output state. This condition allows a small input signal to trigger the SET and RESET transistors to change the output state of the latch.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout.

DETAILED DESCRIPTION OF THE INVENTION

A latch circuit according to the principles of the invention substantially reduces switching time by maintaining at least one of the SET and RESET transistors at an operational point close to the threshold required to trigger the state of the latch. Therefore, a small signal can be utilized to trigger the SET and RESET transistors.

The latch circuit implements this principle by coupling the SET transistor and the RESET transistor to each of the cross-coupled latch transistors to create a SET circuit and a RESET circuit. More specifically, three configurations of the basic latch circuit according to the invention are possible: 1) the SET transistor is base-coupled to one of the latch transistors, (the SET transistor should preferably be coupled to the transistor that will be ON when the output at Q is low, and the RESET transistor is coupled to the transistor that is ON when the output of Q is high), 2) the RESET transistor is base-coupled to one of the latch transistors, or 3) the SET and the RESET transistors are each base-coupled to separate latch transistors. In addition, in each of the three configurations of the latch circuit, the emitter of the SET or RESET transistors are preferably coupled to the emitter of one of the latch transistors, respectively, as will be explained.

The aforementioned configurations cause the current in each transistor to mirror the current in the transistor to which it is base-emitter coupled because the $V_{be}$ of each of the respective transistors match (though the $V_{be}$ of each transistor is not necessarily required to match the $V_{be}$ of the other transistor—e.g., as in a Widlar current mirror configuration—the fact that the bases and the emitters of each of the transistors are coupled causes the performance of each of the transistors to correspond). Thus, whenever one of the latch transistors conducts, one of the SET and RESET transistors also conducts, thereby reducing turn-ON and turn-OFF times when the state of the latch changes.

The distribution of the total current between the SET and RESET transistors and the transistors to which they are connected depends on the area ratio of the transistors. For example, if, when a latch transistor is base and emitter-coupled to a SET transistor, the latch transistor has two times the area of the SET transistor, the latch transistor conducts twice the current in the SET transistor.

Other embodiments of the basic principle of the invention may also be used in PNP latch circuits and oscillator circuits, as will be described below.

Figure 2:
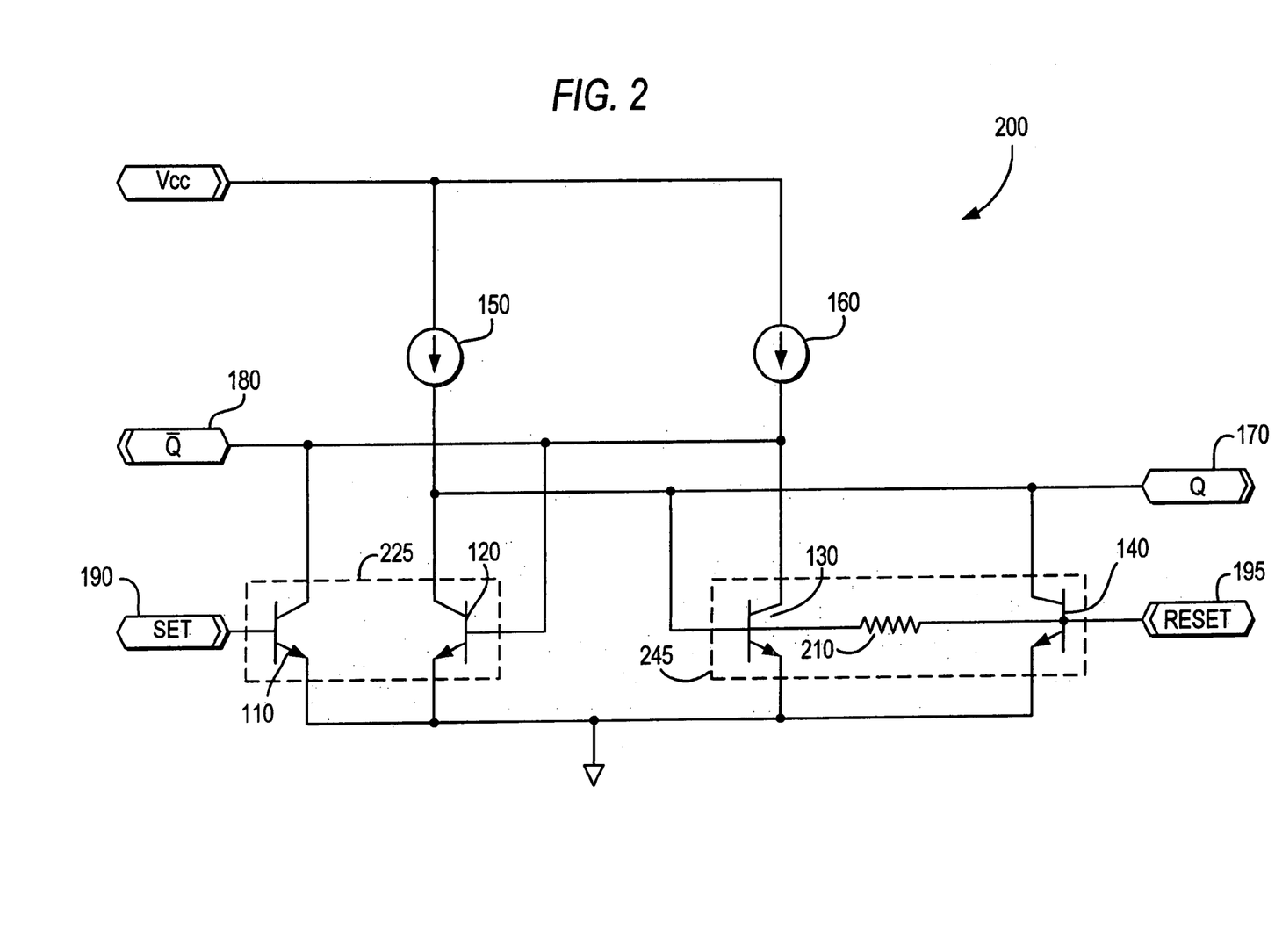
FIG. 2 is a circuit diagram of a latch circuit according to the principles of the invention.

FIG. 2 shows a basic latch circuit 200 according to the principles of the invention. Latch 200 includes transistors 110, 120, 130 and 140, as in latch 100 in FIG. 1. Transistors 110 and 120 form SET circuit 225 and transistors 130 and 140 form RESET circuit 245. SET circuit 225 may operate to change the output of latch 200 and RESET circuit 245 may operate to change the output of the latch 200, as will be described.

In latch 200, however, transistor 140 now substantially mirrors the current of transistor 130 because the emitters are directly coupled and the bases are coupled through resistor 210. In this sense, transistors 130 and 140 form a latch sub-circuit.

In the embodiment shown in FIG. 2, transistor 130 is a 2x device, and transistor 140 is a 1x device (all the ratios and values provided in both the specification and FIGURES illustrate only one possible embodiment and are not intended to limit the invention to particular ratios or values). Therefore, when transistors 140 and 130 are ON, transistor 140 conducts about one half the current of transistor 130. In one embodiment, resistor 210 is 8,000 Ohms, and will not significantly affect the current distribution between the two transistors.

Figure 7:
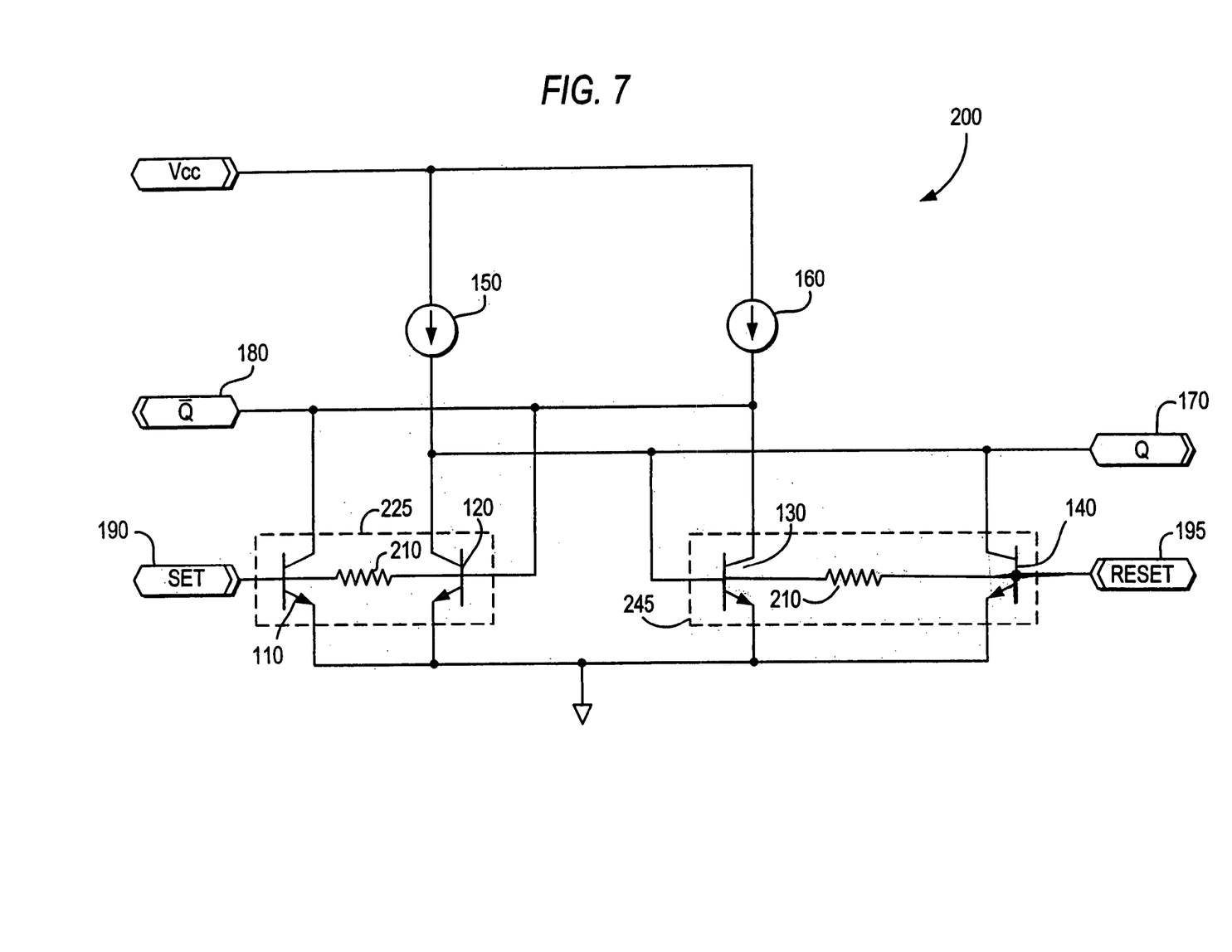
FIG. 7 is a circuit diagram of an alternate latch circuit according to the principles of the invention.

For simplicity, only the RESET side of the circuit has been reconfigured to show the invention. However, the invention can be implemented on either the SET side (see, e.g., FIG. 7 showing the bases of transistors 110 and 120 coupled by resistor 210), the RESET side, or both sides of the latch circuit 200.

Latch 200 operates as follows. When the latch is SET, Q 170 is held high and $\overline{Q}$ 180 is held low. Because Q 170 is high, transistor 130 is ON and therefore, transistor 140 is also ON because it is base-emitter coupled to transistor 130. Thus, in this state, substantially the entire current generated by current sources 150 and 160, in one embodiment each of the sources produces 100 microamperes, is conducted by transistors 130 and 140. The current is distributed between them in a 2:1 ratio because of their respective area ratio mentioned above. Therefore, the current is split between the transistors such that transistor 130 conducts 133 microamperes and transistor 140 conducts 67 microamperes.

To RESET latch 200, current is injected into RESET 195 to cause the base of transistor 140 to lift by about 18 millivolts (as opposed to the 700 millivolts signal required by conventional latches to change the latch output state). This small signal (referred to in this application as a current-driven signal because the change in voltage is so small) injected into the base of transistor 140 causes the base of transistor 140 to rise above a pre-determined value. At this pre-determined value, the current potentially drawn by transistor 140 increases to more than the current that can actually be provided it by current source 150. The collector of transistor 140 then falls, transistor 130 turns OFF, transistor 120 turns ON, and the latch is RESET. Resistor 210, while not impeding the currents between transistors 130 and 140 from being matched, prevents transistor 130 from receiving the small amount of base current injected into the base of transistor 140 to RESET the latch and accidentally turning transistor 130 ON.

The values associated with the different components of latch 200 at which latch 200 is caused to SET and RESET are referred to herein as the "threshold values." The particular values of the signals and components described herein concerning the latch circuit are merely exemplary values, and the invention is not limited to these particular values.

If higher protection against noise in the circuit is required, the ratio of transistors 130 and 140 can be increased. This reduces the static current through transistor 140—i.e., the current through transistor 140 when latch 200 is not changing state and transistor 140 is conducting. Correspondingly, a slightly larger signal is required to turn ON transistor 140's base.

Duplicating this circuit on the SET side produces a latch that is fully current driven, i.e., a signal that creates a very small difference in voltage (e.g., 18 millivolts) is sufficient to SET and RESET the latch. Thus, the operation time of such a latch is substantially reduced.

It follows that a switch according to the invention provides a number of advantages: switching time is reduced, the magnitude of the SET and RESET signals can be much less than an equivalent standard latch because the voltage change across the input capacitance is substantially reduced, threshold current is well-defined by resistor and transistor matching, and, unlike ECL latches, the circuit can operate from a supply as low as one $V_{be}$ and the output is ground-referenced, and does not require level-shift circuitry.

Figure 3:
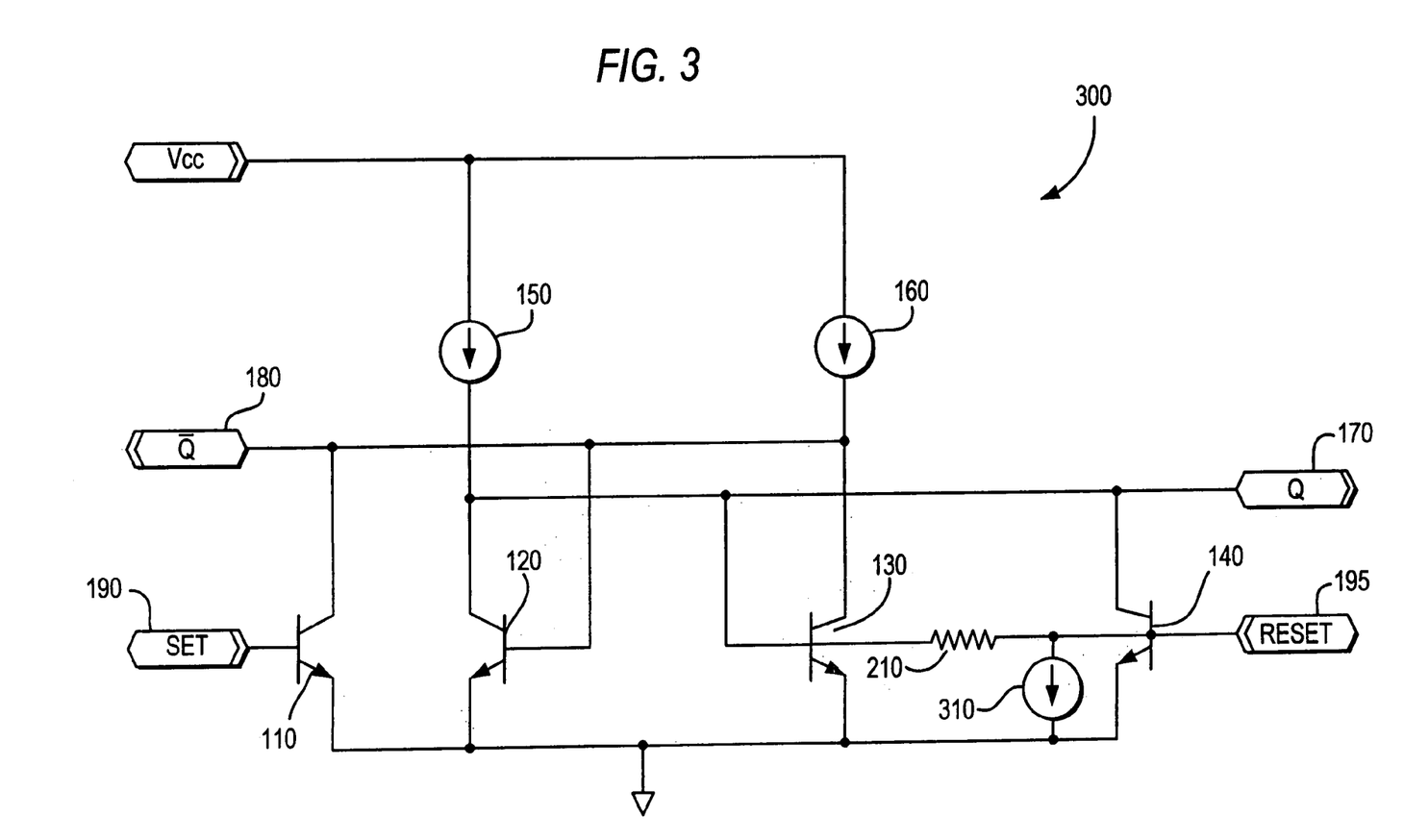
FIG. 3 is a circuit diagram of an alternate latch circuit according to the principles of the invention.

The basic concept of the circuit, i.e. biasing the switching device to a point close to operation, can be implemented in several additional ways. FIG. 3 shows a latch circuit 300 that uses a current source 310 to de-bias transistor 140 when transistors 130 and 140 are being turned OFF. This current source 310 can be implemented using a resistor. The purpose of current source 310 is to create a known voltage drop to protect against accidental turn-OFF of transistor 130 during RESET procedure.

Figure 8:
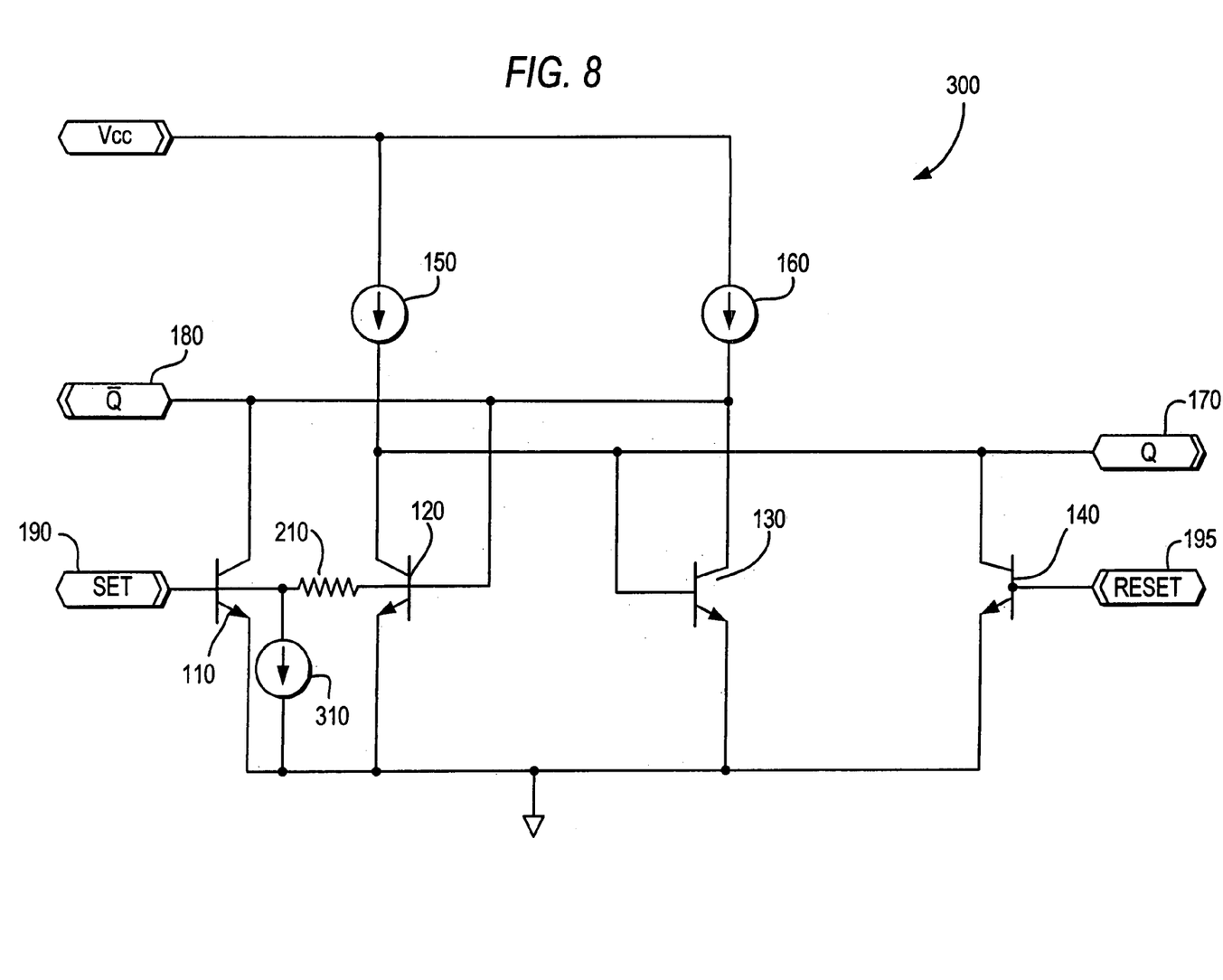
FIG. 8 is a circuit diagram of an alternate latch circuit according to the principles of the invention.

For simplicity, only the RESET side of the circuit has been reconfigured to show the invention. However, the invention can be implemented on either the SET side (see, e.g., FIG. 8 showing the de-bias circuit 310 coupled to de-bias transistor 110), the RESET side, or both sides of the latch circuit 300.

Figure 4:
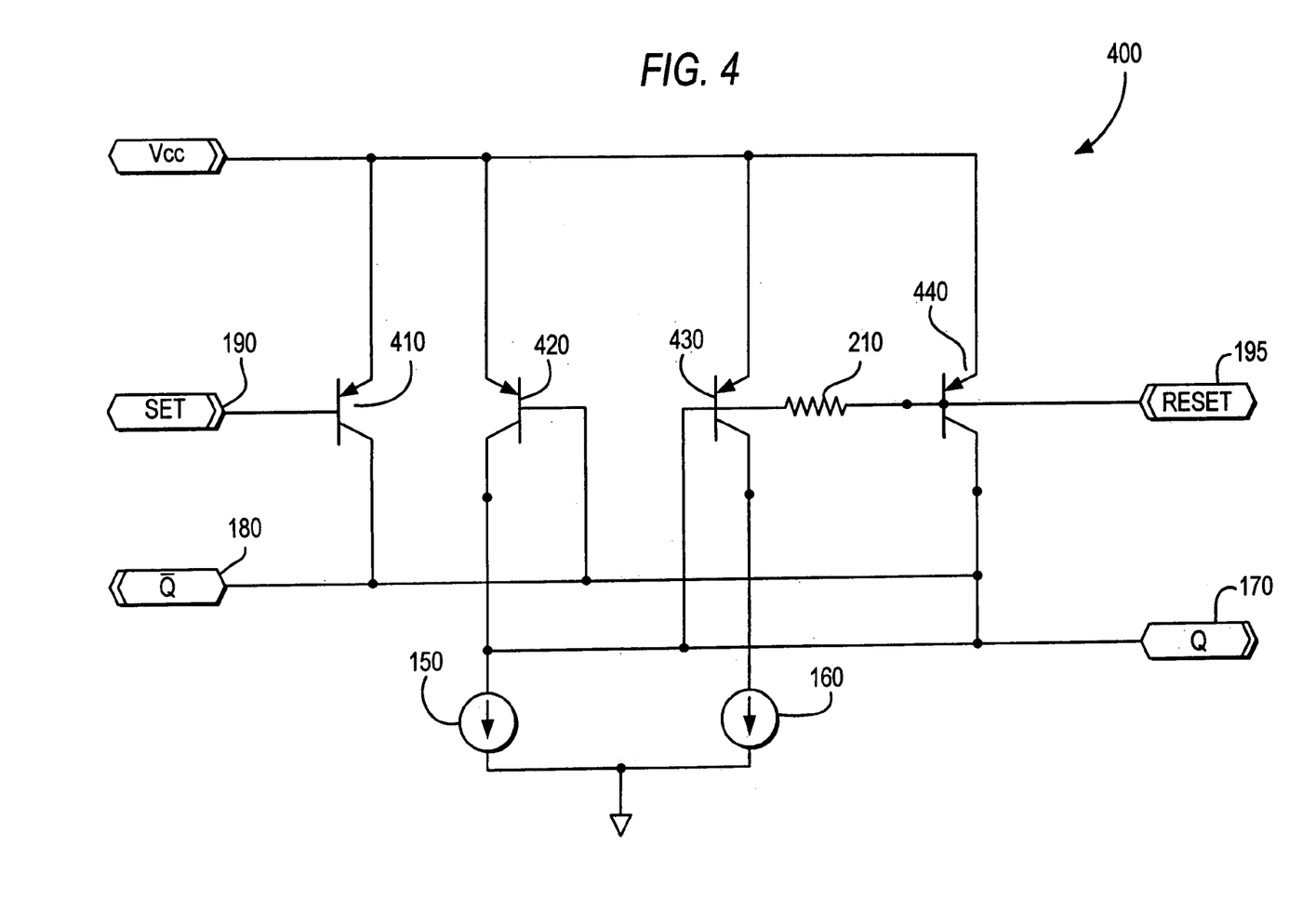
FIG. 4 is a circuit diagram of a PNP latch circuit according to the principles of the invention.

FIG. 4 shows an implementation of the latch using PNP, as opposed to NPN, transistors. The operation of the latch in FIG. 4 is essentially the same as the operation of the latch in FIGS. 2 and 3. PNP transistor 410 corresponds to NPN transistor 110, PNP transistor 420 corresponds to NPN transistor 120, PNP transistor 430 corresponds to NPN transistor 130, PNP transistor 440 corresponds to NPN transistor 140, and the other components of the circuit are the same as in previous FIGURES. The current sources 150 and 160 have been re-configured to provide current sinks to the transistors instead of current sources because the transistors have been changed from NPN to PNP.

Figure 5:
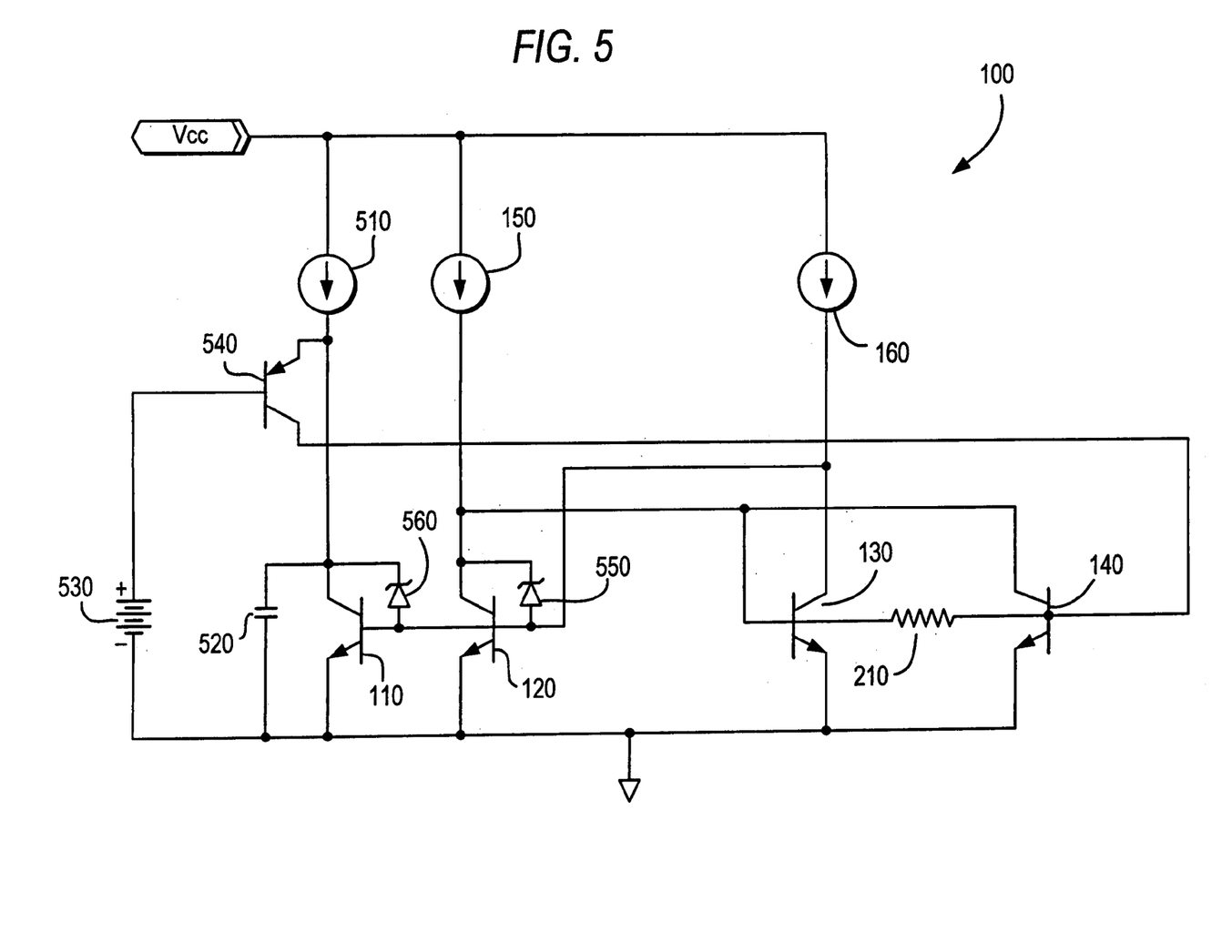
FIG. 5 is a circuit diagram of an oscillator circuit according to the principles of the invention.

FIG. 5 shows an example of an oscillator 500 according to the invention. Oscillator 500 operates on the same principles as the latch FIGS. 2–4, as will be explained.

In the embodiment of the oscillator shown in FIG. 5, current source 510 may charge capacitor 520 with 15 microamperes of current. The upper threshold of charge on capacitor 520 is limited by the voltage drop across the voltage reference 530 plus the $V_{be}$ of transistor 540. Thus, when capacitor 520 is charged, for example, to approximately 1 volt (the $V_{be}$ of transistor 540 plus an exemplary 0.3 volts of voltage reference 530), transistor 540 begins to conduct and diverts the current supplied by current source 510 from capacitor 520 to the base of transistor 140.

Adding base current to transistor 140 performs the same function as raising the RESET input in the previously described latch circuits. Raising the base of transistor 140 turns transistor 140 ON harder than it was before (when the capacitor is charging, transistors 130 and 140 are ON, and transistors 110 and 120 are OFF). Just as described in relation to the latches in the previous FIGURES, turning transistor 140 ON harder drains base current from transistor 130, turning transistor 130 OFF.

Thereafter, the current from current source 160 is redirected to the bases of transistors 110 and 120. This current turns both transistors ON. The current from current source 150 is diverted from transistors 130 and 140 to transistor 120.

When transistor 120 approaches saturation as a result of the current provided by current source 160, transistor 120's excess base current is redirected through the shottky diode 550 to the collector of transistor 120 (Transistors 110, 120, 130, and 140 may preferably be constructed with shottky diodes coupled between the base and the collector of the individual transistors, as mentioned above, in order to prevent saturation. However, the diodes are shown in the FIGURES only where they are required for better understanding of the invention. Otherwise, they have been omitted from the figures).

When transistor 110 is turning ON, transistor 120 is conducting approximately 200 microamperes of current (the current in current source 150 plus the current in current source 160). Because transistor 110's base is coupled to the base of transistor 120, transistor 110 turns ON as well when the current from current source 160 is diverted to transistor 120. In one embodiment of the invention, transistor 110 is fabricated to be in a 4:1 ratio with transistor 120. Thus, because transistors 110 and 120 form a current mirror, transistor 110 is able to conduct up to 800 microamperes of current when transistor 120 is conducting 200 microamperes. Transistor 110 is then able to relatively quickly discharge capacitor 520 with 800 microamperes of current.

After capacitor 520 is fully discharged (e.g., to about 0.4 volts which is approximately the collector-emitter voltage drop of transistor 110), transistor 110 approaches saturation. Thereafter, its shottky diode 560 turns ON, and transistor 110 draws current away from the base of transistor 120. In this state, the total current from the current sources is approximately 215 microamperes. This current is shared between transistors 110 and 120 in a ratio of 4:1 (about 172 microamperes to about 43 microamperes.

With only 43 microamperes in transistor 120, its collector rises, and the latch is RESET. Thereafter, transistors 130 and 140 turn back ON, and current source 510 begins again to charge capacitor 520. Thus, the charging and discharging cycles of capacitor 520 operate in a fashion similar to the operation of the SET and RESET of the latches in the previous FIGURES.

The oscillator circuit shown in FIG. 5 has a number of advantages over conventional oscillators. It allows high speed operation without the complexity, high device count, and level-shifting circuitry associated with ECL. It also allows low voltage operation. The oscillator circuit is operable down to a $V_{cc}$ voltage supply of about 200–400 millivolts above one $V_{be}$. Finally, the circuit maximizes voltage swing on the oscillator capacitor because its high threshold can be set close to $V_{cc}$, while its low threshold is close to ground.

Figure 6:
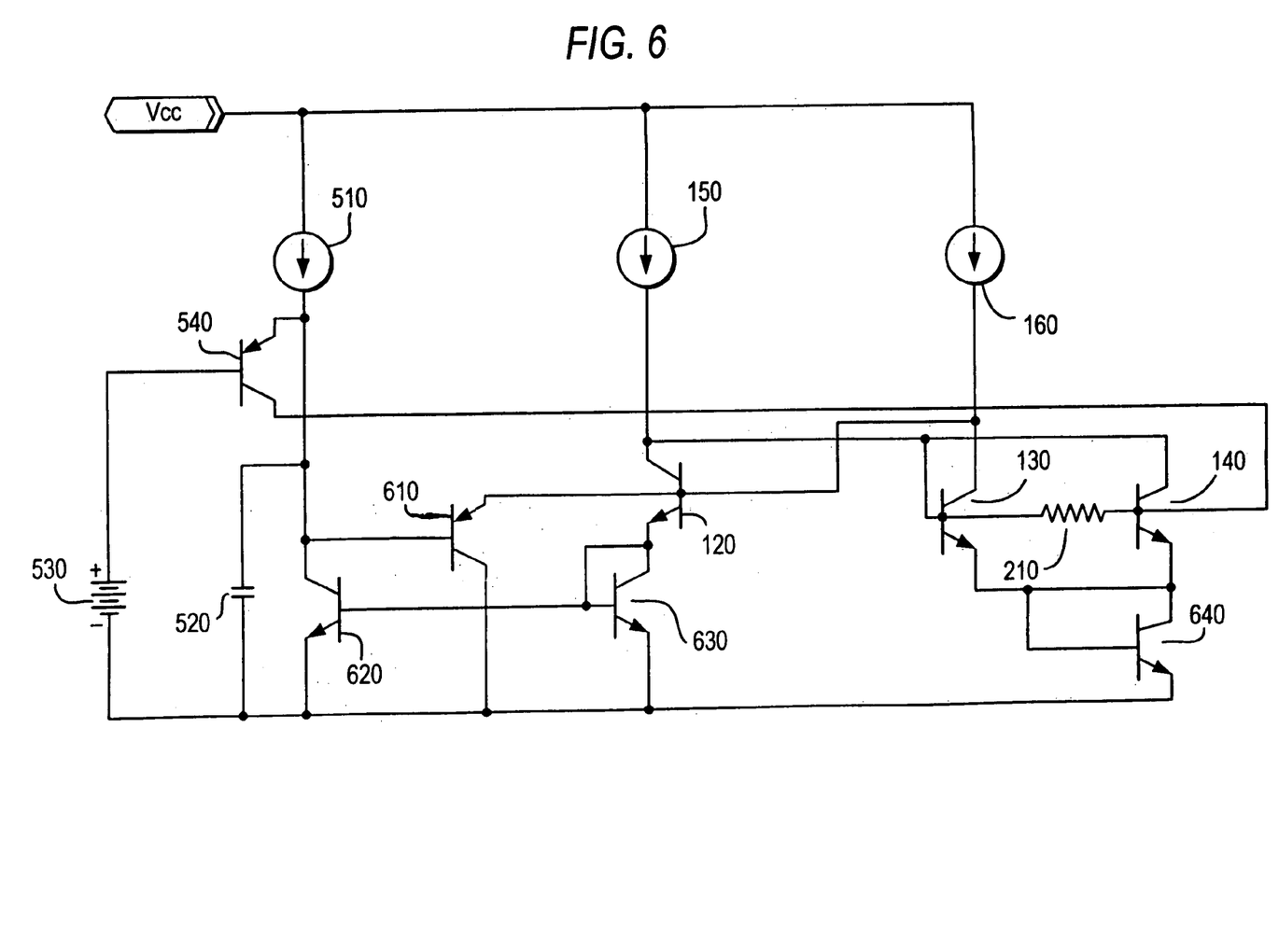
FIG. 6 is a circuit diagram of a temperature-compensated oscillator circuit according to the principles of the invention.

FIG. 6 shows a further development of the oscillator circuit shown in FIG. 5. This circuit provides substantially temperature-compensated oscillator amplitude on the capacitor.

For temperature independent operation of the oscillator circuit in FIG. 6, the voltage difference between the upper threshold of capacitor 520 and its lower threshold is constant, independent of temperature. It follows that when the voltage difference between the upper and lower thresholds remain constant, the oscillator oscillates with a constant period.

For the oscillator circuit in FIG. 6 to oscillate in a temperature-compensated fashion, the $V_{be}$ of transistor 540 must be compensated for changes in temperature of the circuit because the $V_{be}$ of transistor 540 controls the high threshold of capacitor 520. In one embodiment of the invention, the $V_{be}$ of transistor 540 is temperature-compensated by setting the low threshold of the capacitor to $V_{be120}+V_{be630}-V_{be610}$, approximately one $V_{be}$, as will be explained. By setting the low threshold to the equivalent of one $V_{be}$, the low threshold varies together with the high threshold relative to temperature, and the oscillations of the oscillator circuit are temperature-compensated.

The circuit shown in FIG. 6 operates as follows to set the low threshold of capacitor 520 to one $V_{be}$. At the beginning of the discharge cycle, transistor 120 turns ON transistors 620 and 630. When transistor 620 turns ON, it discharges capacitor 520. Transistor 620 continues to discharge capacitor 520 until capacitor 520, which is coupled to the base of transistor 610, reaches approximately one $V_{be}$.

When capacitor 520 reaches one $V_{be}$, PNP transistor 610 turns ON. Transistor 610 turns ON at this point because the emitter of transistor 610 is coupled to the base of transistor 120 which is two $V_{be}$s above ground (its own $V_{be}$, and the $V_{be}$ of transistor 630) and therefore requires the base voltage of transistor 610 to be one $V_{be}$ lower than the base of transistor 120. When transistor 610 turns ON, it acts as a pass device and pulls current from current sources 150 and 160, thereby shutting transistors 120, 620, and 630 OFF. When transistor 620 shuts OFF, capacitor 520 begins its charging cycle.

The $V_{be}$s of transistors 630 and 640 provide temperature compensation for the $V_{be}$ of transistor 610. In addition, supply 530 must be increased, e.g., to about 2 volts.

Thus, a latch circuit that reduces switching time by maintaining the SET and RESET transistor close to a switching threshold is provided. Persons skilled in the art will appreciate that the present invention can be practiced by other than the described embodiments, which are presented for purposes of illustration rather than of limitation, and the present invention is limited only by the claims which follow.

What is claimed is:

1. A method of changing the output of a latch circuit, the output having a first state and a second state, the latch circuit comprising a SET transistor and a RESET transistor, the method comprising;

at the first state, conducting a first current in a first latch transistor and a SET transistor, said first latch transistor having a base coupled by a resistive element to the base of the SET transistor, and using a portion of the first current to bias the SET transistor at an operational point lower than a first threshold;

at the second state, conducting the first current in a second latch transistor and a RESET transistor, said second latch transistor having a base coupled by a resistive element to the base of the RESET transistor, and using a portion of the first current to bias the RESET transistor at an operational point lower than a second threshold;

to vary the output from the first state to the second state, providing a second current that raises the base of the SET transistor to the first threshold; and to vary the output from the second state to the first state, providing the second current that raises the base of the RESET transistor to the second threshold.

2. The method of claim 1, the providing the first current comprising providing the first current from two substantially equal current sources.

3. The method of claim 2, the providing the second current comprising causing a relatively small voltage change in the base of one of the SET and RESET transistors.

4. An oscillator that oscillates an output using the method of claim 1.

5. The oscillator of claim 4 further comprising temperature compensating the oscillator.

* * * * *